United States Patent
Treen et al.

(10) Patent No.: US 7,420,500 B2
(45) Date of Patent: Sep. 2, 2008

(54) ELECTROMAGNETIC RADIATION ABSORBER

(75) Inventors: Andrew Shaun Treen, Farnborough (GB); Christopher Robert Lawrence, Farnborough (GB); John Roy Sambles, Exeter (GB); Alastair Paul Hibbins, Exeter (GB)

(73) Assignee: QinetiQ Limited (GB)

( * ) Notice: Subject to any disclaimer, the term of this patent is extended or adjusted under 35 U.S.C. 154(b) by 0 days.

(21) Appl. No.: 10/565,047

(22) PCT Filed: Jul. 19, 2004

(86) PCT No.: PCT/GB2004/003145
§ 371 (c)(1),
(2), (4) Date: Jan. 17, 2006

(87) PCT Pub. No.: WO2005/013663
PCT Pub. Date: Feb. 10, 2005

(65) Prior Publication Data
US 2006/0202883 A1 Sep. 14, 2006

(30) Foreign Application Priority Data
Jul. 18, 2003 (GB) .................... 0316877

(51) Int. Cl.
*H01Q 17/00* (2006.01)
*H05K 9/00* (2006.01)
*G01S 13/00* (2006.01)

(52) U.S. Cl. ................ 342/4; 342/1; 219/678; 219/679; 219/680

(58) Field of Classification Search ................ 342/1–4, 342/175; 219/678–681, 685, 736–744
See application file for complete search history.

(56) References Cited

U.S. PATENT DOCUMENTS

| 2,599,944 | A |   | 6/1952  | Salisbury |
|-----------|---|---|---------|-----------|
| 3,300,781 | A | * | 1/1967  | Clough et al. ................. 342/3 |
| 3,441,933 | A | * | 4/1969  | Tuinila et al. ................. 342/4 |
| 3,887,920 | A | * | 6/1975  | Wright et al. ................. 342/1 |
| 4,891,468 | A | * | 1/1990  | Andrae ......................... 342/4 |
| 5,047,296 | A | * | 9/1991  | Miltenberger et al. ......... 342/1 |
| 5,276,447 | A | * | 1/1994  | Shingo ......................... 342/2 |
| 5,307,068 | A | * | 4/1994  | Hartemann .................... 342/1 |
| 5,576,710 | A | * | 11/1996 | Broderick et al. ............. 342/1 |
| 5,617,096 | A | * | 4/1997  | Takahashi ..................... 342/4 |
| 5,627,541 | A | * | 5/1997  | Haley et al. ................... 342/1 |
| 5,788,110 | A | * | 8/1998  | Alhamad ....................... 342/4 |
| 5,872,534 | A | * | 2/1999  | Mayer ........................... 342/1 |

(Continued)

FOREIGN PATENT DOCUMENTS

DE           3508888 A1      9/1986

(Continued)

*Primary Examiner*—Bernarr E Gregory
(74) *Attorney, Agent, or Firm*—McDonnell Boehnen Hulbert & Berghoff, LLP

(57) ABSTRACT

An electromagnetic radiation absorber for absorbing radiation in the wavelength range $\lambda_{min}$ to $\lambda_{max}$. The absorber has a conductor layer in contact with a dielectric layer. The conductor layer carries a plurality of apertures of sub-wavelength dimension and the thickness of the absorber is less than $\lambda_{min}/4n$, where n is the refractive index of the dielectric. The dielectric layer may be sandwiched between two conductor layers, one of which has the structure described above. The invention is also directed to various articles comprising such an absorber.

22 Claims, 4 Drawing Sheets

U.S. PATENT DOCUMENTS

| | | | |
|---|---|---|---|
| 5,976,666 A * | 11/1999 | Narang et al. | 342/1 |
| 6,037,046 A * | 3/2000 | Joshi et al. | 342/1 |
| 6,538,596 B1 * | 3/2003 | Gilbert | 342/1 |
| 6,700,525 B2 * | 3/2004 | Gustafsson | 342/1 |

FOREIGN PATENT DOCUMENTS

| | | |
|---|---|---|
| GB | 2253519 A | 9/1992 |
| GB | 2315600 A | 4/1998 |
| GB | 2336472 A | 10/1999 |

* cited by examiner

ELECTROMAGNETIC RADIATION ABSORBER

BACKGROUND OF THE INVENTION (1) Field of the Invention

This invention relates to the field of electromagnetic radiation absorbing or attenuating devices and more specifically relates to the field of microwave radiation absorbers.

(2) Description of the Art

Electromagnetic radiation absorbing materials (RAMs) are useful in a range of applications. For example, multipath reflections of TV signals can cause image ghosting. Materials, such as ferrite tiles, that can attenuate reflected radiation can improve signal quality.

At airports surveillance radar signals reflect from airport buildings resulting in stray secondary radar emissions. To reduce these secondary emissions some airport buildings (e.g. the World Cargo Centre at Heathrow Airport, UK) are covered in radar absorbing materials.

A further use of RAMs is in the automotive industry. Current and future car designs often now include a car based radar system for aiding parking manoeuvres and monitoring car separation distances whilst en route (i.e. collision warning systems). Generally only straight line returns from the car in front/behind are desired and so absorbent coatings are used to cut down on spurious reflections.

Two common radiation absorbing systems are Salisbury screens (see U.S. Pat. No. 2,599,944) and magnetic paint based arrangements.

A Salisbury screen is essentially a lossy material, such as carbon fibre, which is typically held at a quarter-wavelength separation from a metallic backing surface by a dielectric spacing material. This arrangement suffers from being bulky and difficult to apply to objects of complex geometry. For a typical airport application the radiation in question has a free-space wavelength of approximately 30 cm giving a thickness of up to 7.5 cm for the screen (the exact thickness being dependent upon the refractive indices of the constituent materials).

Magnetic paint arrangements generally comprise a metallic backing surface covered with a layer of magnetic paint. This arrangement is not as thick as a Salisbury screen but is heavy.

SUMMARY OF THE INVENTION

It is therefore an object of the invention to provide an electromagnetic radiation absorbing material that substantially overcomes or mitigates the problems associated with prior art systems, namely those of weight, size and flexibility.

According to an aspect of this present invention there is provided an electromagnetic radiation absorber for absorbing radiation in the wavelength range $\lambda_{min}$ to $\lambda_{max}$ comprising a dielectric layer sandwiched between first and second conductor layers wherein the first conductor layer carries a plurality of apertures of sub-wavelength dimension and wherein the thickness of the absorber is less than $\lambda_{min}/4n$, where n is the refractive index of the dielectric.

It should be noted that that references to wavelength above are to the in vacuo wavelength.

The invention provides for a multi-layer structure that acts as a radiation absorbing device. First and second conductor layers sandwich a dielectric core. One of the conductor layers contains a number of sub-wavelength apertures (i.e. less than $\lambda_{min}$ in at least one dimension) which expose the dielectric core to the atmosphere.

The apertures could be small, discrete crosses or L-shapes but more conveniently are slits wherein the width of the slit is less than $\lambda_{min}$.

It should be noted that the conductor layers do not have to be in direct contact with the dielectric core. For example, there may be a thin adhesive or other material layer separating them.

Any material that has a metallic response at the electromagnetic wavelengths of interest can be used as a conductor material. The thickness of such a material must be such that it is at least partially opaque to the target wavelengths (this is determined by skin depth calculations which will be known to the skilled man). For example, for microwave applications the conductor layers would generally be of the order of 5 microns and above in thickness.

When radiation of a certain wavelength is incident upon the first conductor layer it is absorbed by the multi-layer structure. The multi-layer structure is less than a quarter-wavelength in its total thickness and is therefore thinner and lighter compared to prior art systems and far less bulky than Salisbury screens. It can also be designed in such a manner as to be flexible, enabling it to be applied to curved surfaces.

The above aspect of the invention provides for two conductor layers to form the absorber. However, in cases where the material is to be applied to a metallic surface (e.g. a car) then only the first conductor layer and the core layer are required since the metal structure itself will act as the second conductor layer as soon as the material is applied to the structure.

Therefore, according to a further aspect of the invention there is provided an electromagnetic radiation absorber for absorbing radiation in the wavelength range $\lambda_{min}$ to $\lambda_{max}$ comprising a conductor layer in contact with a dielectric layer wherein the conductor layer carries a plurality of apertures of sub-wavelength dimension and wherein the thickness of the absorber is less than $\lambda_{min}/4n$, where n is the refractive index of the dielectric.

As above the apertures can take the form of discrete crosses, L-shapes or more conveniently slits.

[Note: the following discussion applies to both aspects of the invention]

Conveniently, the absorber will also absorb radiation when its thickness is far less than a quarter-wavelength of the incident radiation. For example, radiation will be absorbed in the instances where the material thickness is equivalent to a $1/10^{th}$, $1/100^{th}$ or even a few $1/1000^{ths}$ the wavelength of the incident radiation.

The arrangement of slits on the first conductor layer affects the wavelength or wavelengths of radiation absorbed by the structure. Preferably the slit arrangement is periodic.

Preferably the slit arrangement comprises parallel slits. It has been determined by the inventors that for a parallel slit arrangement radiation of wavelength A will be absorbed according to the following relationship:

$$\lambda_N \approx 2nG/N$$

where $\lambda$ is the wavelength in the range $\lambda_{min}$ to $\lambda_{max}$ where maximum absorption occurs, n is the refractive index of the core, G is the slit spacing and N is an integer ($\geq 4$). Note: It is presumed that the slits are narrow in comparison to the wavelength. It is further presumed that the radiation is linearly polarised such that the electric field vector is orientated perpendicular to the axis of the slit (i.e. its length): by definition typical to this field of research, if the plane of incidence is parallel to the slit then the radiation must be TE-(s-)-polarised (electric vector perpendicular to the plane of incidence); if the plane of Incidence is parallel to the plane of incidence then the radiation must be TM-(p-)-polarised (electric vector within the plane of incidence).

It can be seen from the above relationship that the wavelength of radiation that is absorbed is linearly related to the slit spacing G and also the refractive index of the core. Varying either of these parameters will enable a specific wavelength to be absorbed by the structure.

It can also be seen that radiation will also be absorbed at a number of wavelengths corresponding to different values of N.

This equation is an approximation that is most accurate when the width of the core is equal to the width of the slit. If the slit width is decreased then there is a gradual shift of the resonance to longer wavelengths (the exact shift being related to the ratio of slit width and core thickness).

It should also be noted that only odd values of N give rise to resonances if the radiation is made incident upon the structure at normal incidence.

Power is dissipated by both the core and—to a certain degree—the metal claddings, and hence the permittivities and permeabilities of these materials are important parameters in the design process.

In order to remove any dependency on the azimuthal orientation of the sample relative to the incident radiation the first metallic layer preferably comprises two orthogonal sets of parallel slits (a "bi-grating" arrangement). This also has the advantage of reducing polarisation effects With a single set of parallel slits (a "mono-grating" arrangement) only one linear polarisation is absorbed for any orientation (namely the polarisation state with the electric field component perpendicular to the slit direction). The bi-grating arrangement however absorbs both polarisations.

More preferably, for parallel slit arrangements there should be three sets of parallel slit arrangements at 60 degree azimuthal separation (i.e. forming a triangular pattern).

For "wide" slits (i.e. slit width comparable to the wavelength of the incident radiation) the absorption wavelength varies according to the angle at which the radiation is incident to the surface of the first metallic layer. As the slit width decreases then the angular dependency becomes less pronounced. Therefore preferably the slits are thin compared to the wavelength of radiation to be absorbed.

For wavelengths λ corresponding to and in close proximity to the microwave region of the electromagnetic spectrum (e.g. λ's generally in the range millimetres to metres) then typically slit widths are less than 400 microns and preferably less than 50 microns.

Conveniently the material chosen to be used in the core is capable of altering its refractive index in order to control the wavelengths of radiation that are to be absorbed. For example, a polymer dispersed liquid crystalline material can be used as the core. If the absorber structure is arranged such that a voltage can be applied across the core material its refractive index can be altered and the absorbed wavelengths will shift in a tailored manner.

The above arrangements are essentially narrowband absorbers (for example, for a mono-grating structure based around a common polymer core with slit separation of approx. 10 mm and a slit width of 3 mm, radiation is absorbed in the range 28-35 mm [$\lambda_{min}$ to $\lambda_{max}$] with a maximum absorption at 32 mm).

However, if the slit separation is varied across the surface of the first metal layer then absorption will occur over a wider range of wavelengths. The introduction of curved, kinked or slanted slits will therefore induce broader wavelength bands of operation.

A RAM according to the invention can be incorporated into a range of structures, e.g. onto buildings to cut down on radar reflections and onto cars.

The RAM according to this invention can be constructed such that it is flexible. If it is backed with an adhesive material it can be applied to any surface of interest in the form of a tape or appliqué film. The ability to construct a very thin absorber (relative to the wavelength of radiation to be absorbed) means that it can effectively be moulded to any surface.

A further use for the RAM according to the invention includes packaging for microwave meals which could be tuned to absorb microwaves and therefore act as heating elements.

A RAM according to the present invention could also be used in a tagging system. For example the absorber could be applied to a surface in a barcode-like pattern. Irradiating the surface with radiation that is known to be absorbed by the RAM will then reveal the presence of the "barcode" pattern. Alternatively a series of "swatches" of RAM, each attuned to a different wavelength could be arranged on an article to be tagged to form a tagging code.

Where the invention comprises a three layer structure (i.e. metal—dielectric—metal layer) it is further possible to construct a frequency selective structure by providing a plurality of sub-wavelength slit structures in the second conductor layer as well as the first conductor layer. This structure acts as a narrowband filter and the wavelength of the transmitted radiation can be varied by altering the relative alignment of the slit arrays on the two conductor surfaces.

DESCRIPTION OF THE FIGURES

Embodiments of the invention are described below by way of example only and in reference to the accompanying drawings in which.

DETAILED DESCRIPTION OF THE INVENTION

Figure 1:
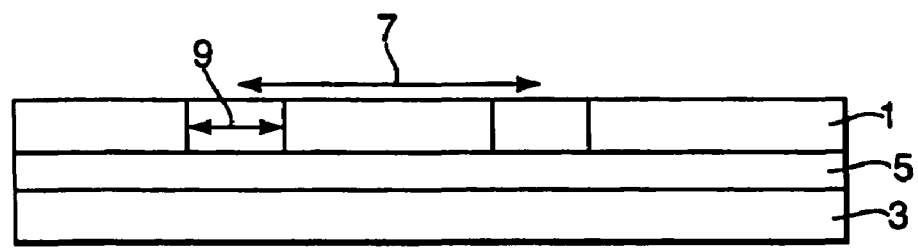
FIG. 1 shows a basic representation of an electromagnetic radiation absorber according to the present invention.

Turning to FIG. 1, a multi-layer electromagnetic radiation absorbing material comprises a first conductor layer 1 and a second conductor layer 3. Conductors 1,3 sandwich a dielectric core 5.

The first conductor layer 1 has a number of slits of separation 7 and width 9.

In an example of an absorber constructed for use as a microwave absorber the thickness of each of the copper conductor layers 1 and 3 was 18 microns and the thickness of the dielectric was approximately 360 microns. Slit separation was 10 mm and slit width 50-400 microns. Such a construction lead to absorption at around a wavelength of 40 mm. It should be noted that the total thickness of the material (approx. 400 microns) is around $\frac{1}{100}^{th}$ the wavelength of the incident radiation.

Figure 2:
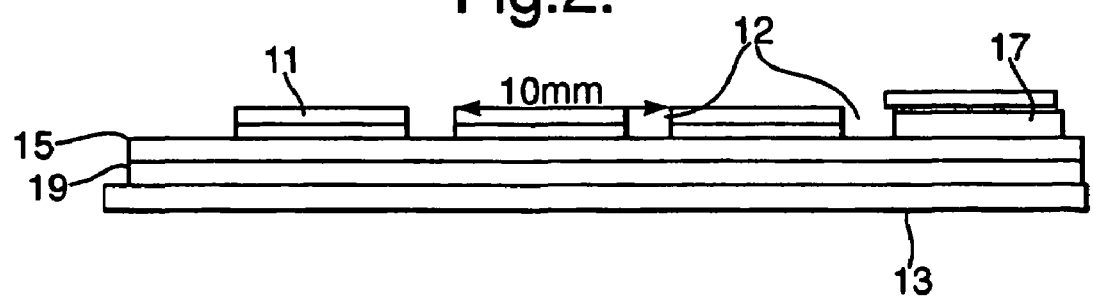
FIG. 2 shows a further absorber according to the present invention

FIG. 2 shows a further example of a radiation absorber according to the present invention. In this case copper layers 11 and 13 sandwich a polyester layer 15. The upper copper layer 11 contains a slit arrangement 12.

The structure of FIG. 2 was constructed by autocatalytically depositing the copper layer 11 onto the polyester layer

15. A sensitising material 17 was used to promote the deposition reaction. A layer of adhesive 19 bonds the polyester layer 15 to the bottom copper layer 13.

In the example constructed and tested copper layer 11 had thickness 1.5-2 microns, sensitiser layer 17 had thickness approx. 3-4 microns, polyester layer 15 had thickness approx. 130 microns, adhesive layer 19 had thickness approx. 60 microns and bottom copper layer had thickness 18 microns.

Figure 3:
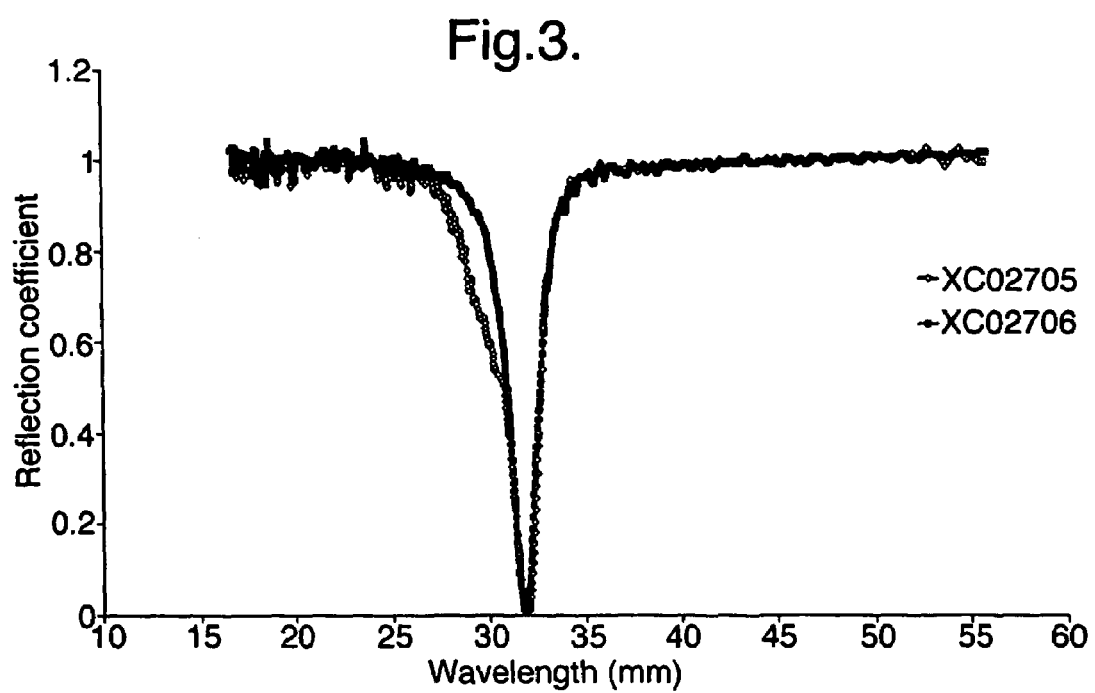
FIG. 3 shows a plot of reflection coefficient as a function of wavelength for the structure of FIG. 2 with a mono-grating slit structure.

Different samples of the material of FIG. 2 were tested. FIG. 3 shows the results for a mono-grating slit structure of pitch 10 mm. As can be seen a sharp absorption trough can be seen at approximately 32 mm. At this point the reflection coefficient is around 0.003-0.004.

Figure 4:
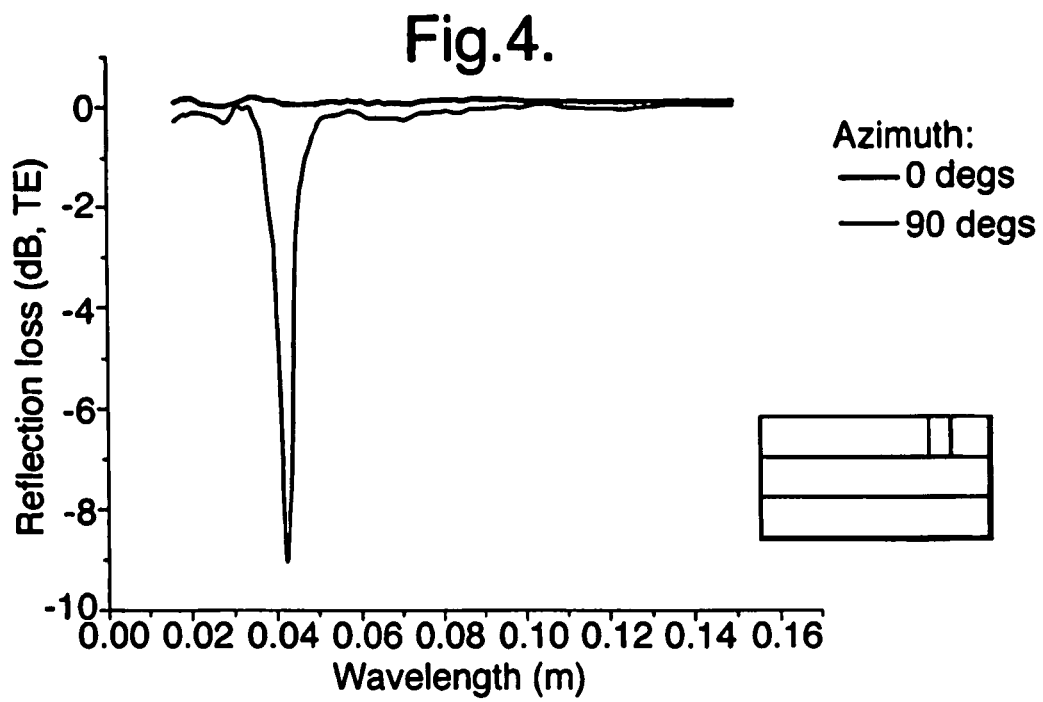
FIG. 4 shows reflection loss in dB against wavelength for a mono-grating slit arrangement

FIG. 4 shows reflection loss in dB against wavelength for a mono-grating slit arrangement on a sample where the total thickness was approximately 0.5 mm and the conductor layers (copper in this case) were both approximately 0.1 mm thick. Slit width was 0.3 mm and the pitch of the slits was 10 mm. Radiation was incident at 20 degrees to the surface of the material. (Note: an azimuthal angle of zero implies that the plane of incidence is perpendicular to the slit direction).

It can be seen here that the orientation of the absorber relative to the polarisation of the incident radiation affects the absorbent properties of the sample. When the electric component of the incident radiation is perpendicular to the groove direction (i.e. TE polarised radiation at 90 degrees azimuth) then there is strong absorption. When it is parallel there is no absorption.

Figure 5:
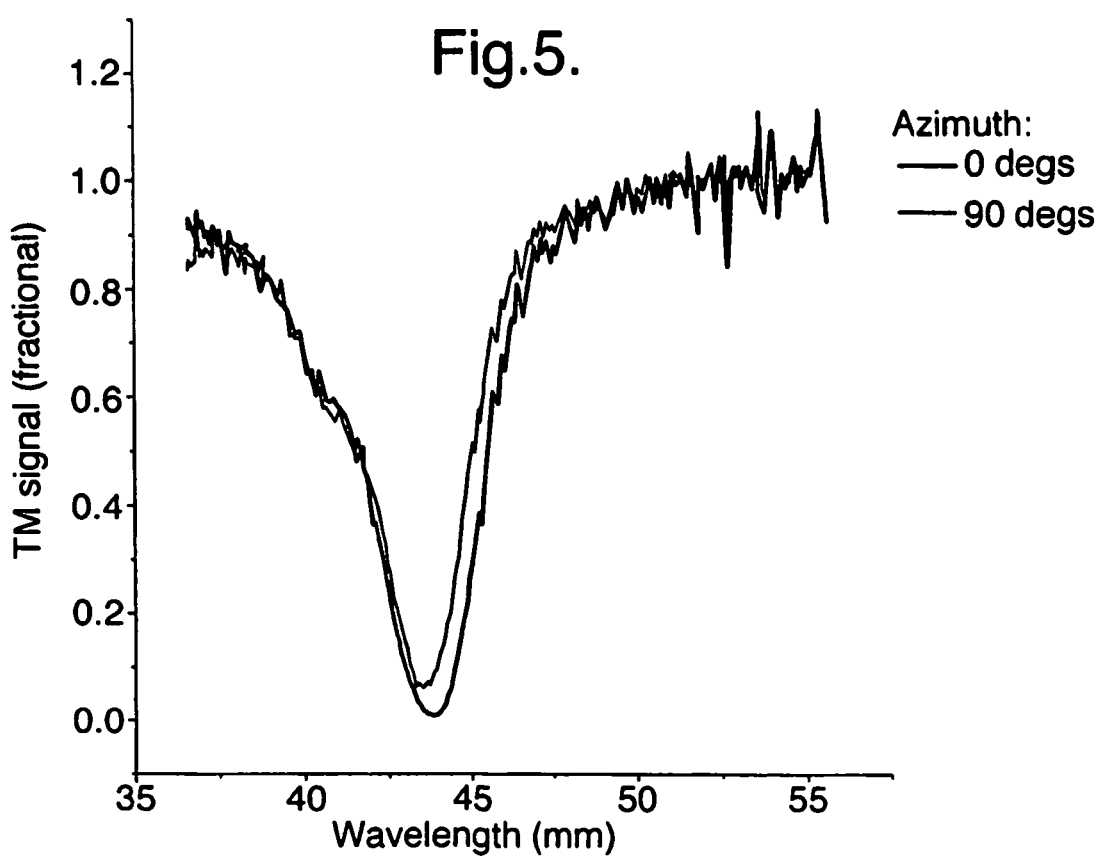
FIG. 5 shows a plot of fractional reflection versus wavelength for a bi-grating slit arrangement

FIG. 5 shows a plot of fractional reflection versus wavelength. In this case the slit structure is a bi-grating arrangement. The material itself has approximately the same dimensions as for FIG. 4 and both sets of parallel slits have a pitch of 10 mm. It can be seen that the azimuthal orientation of the material now has no effect on the absorbent properties of the material.

Figure 6:
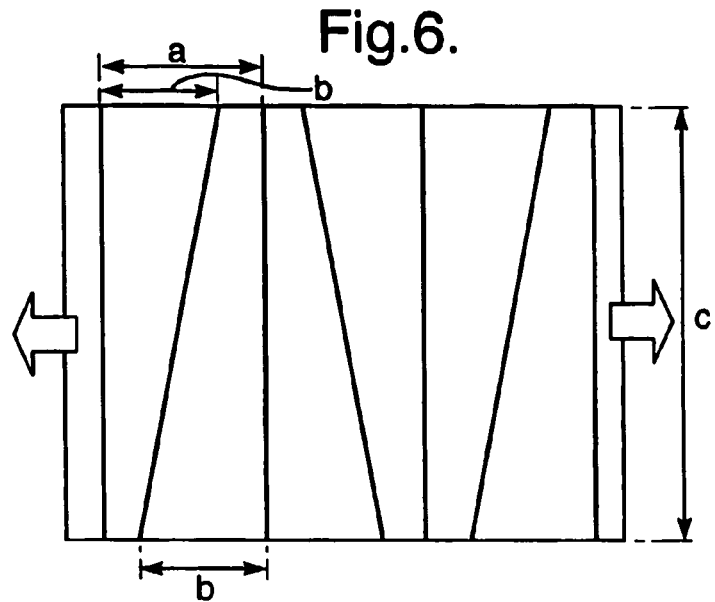
FIG. 6 shows a slit arrangement for broadband absorption

FIG. 6 shows a slit arrangement designed to broaden the waveband over which absorption takes place. Here every second slit in a mono-grating arrangement is twisted slightly. A similar result could be obtained for curved lines of periodically oscillating separation. The dimensions are as follows: a=20 mm, b=15 mm and c=45 cm.

Figure 7:
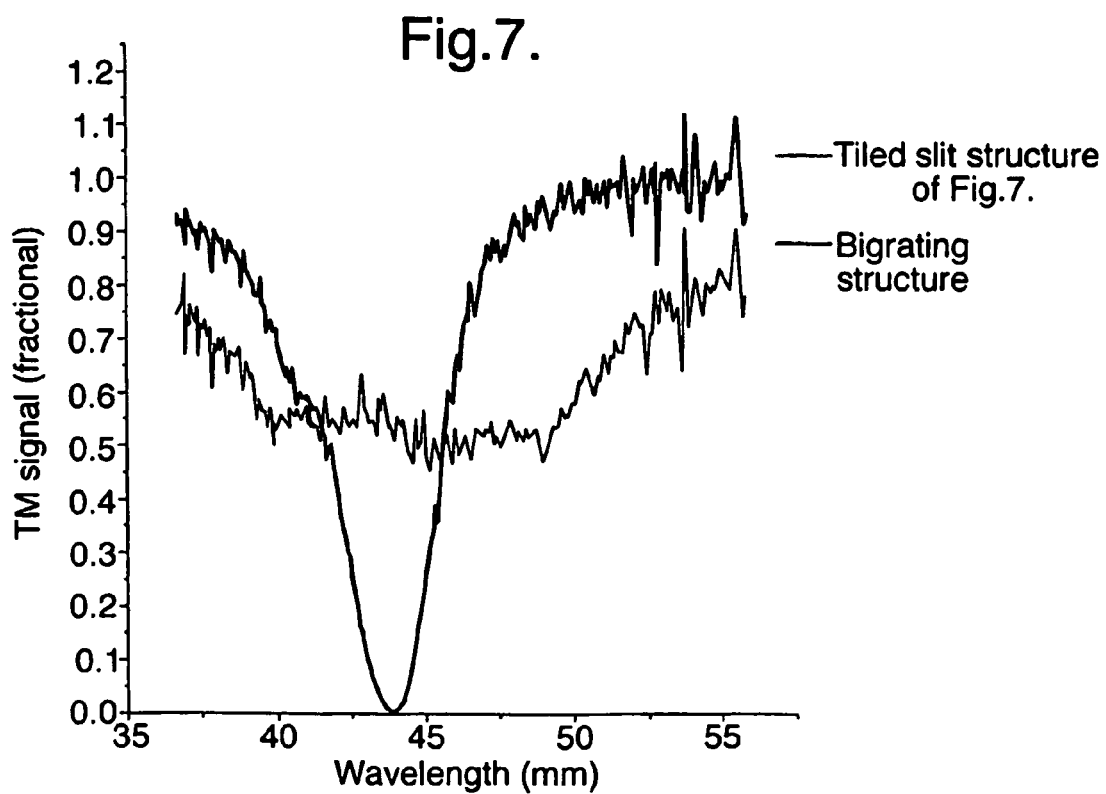
FIG. 7 shows a plot of fractional reflection against wavelength for the slit arrangement of FIG. 6.

FIG. 7 shows the results of the arrangement of FIG. 6 as a plot of fractional reflection against wavelength. Compared to a bi-grating arrangement the absorption occurs over a much wider range of wavelengths.

Although the above examples relate to the absorption of millimetric to centimetric wavelengths the skilled person will appreciate that the above principles can be applied with different slit structures and layer thicknesses in order to produce an electromagnetic absorbing material that can absorb radiation in other parts of the e/m spectrum, e.g. infra-red, radiowave etc.

The invention claimed is:

1. An electromagnetic radiation absorber for absorbing electromagnetic radiation in the wavelength range $\lambda_{min}$ to $\lambda_{max}$ within the electromagnetic wavelength range comprising a conductor layer in contact with a dielectric layer wherein the conductor layer includes a plurality of slits in a grating arrangement each slit having at least one dimension that is less than $\lambda_{min}$, wherein the thickness of the absorber is less than $\lambda_{min}/4n$, where n is the refractive index of the dielectric.

2. An electromagnetic radiation absorber as claimed in claim 1 wherein the thickness of the absorber is less than $\lambda_{min}/10$.

3. An electromagnetic radiation absorber as claimed in claim 1 wherein the slit structures are periodic in nature.

4. An electromagnetic radiation absorber as claimed in claim 1 wherein the slit structures are curved.

5. An electromagnetic radiation absorber as claimed in claim 1 wherein the slit structures comprise a series of non-parallel slits.

6. An electromagnetic radiation absorber as claimed in claim 1 wherein the slit structures comprise a parallel slit arrangement.

7. An electromagnetic radiation absorber as claimed in claim 6 wherein the wavelength λ of radiation absorbed is determined by $$\lambda \approx 2nG/N$$

where λ is the wavelength in the range $\lambda_{min}$ to $\lambda_{max}$ where maximum absorption occurs, n is the refractive index of the dielectric, G is the spacing of the slits and N is an integer greater than or equal to 1.

8. An electromagnetic radiation absorber as claimed in claim 1 wherein the slit structure comprises two orthogonal sets of parallel slits.

9. An electromagnetic radiation absorber as claimed in any of claim 1 wherein the slit structures comprise three sets of parallel slits at 60 degree azimuthal separation.

10. An electromagnetic radiation absorber as claimed in claim 1 wherein the slit width is less than 400 microns.

11. An electromagnetic radiation absorber as claimed in claim 10 wherein the slit width is less than 50 microns.

12. An electromagnetic radiation absorber as claimed claim 1 wherein the dielectric comprises a material having an actively variable refractive index.

13. An adhesive tape comprising an electromagnetic radiation absorber according to claim 1.

14. A heating element for use in a microwave oven comprising an electromagnetic absorber as claimed in claim 1.

15. An electromagnetic radiation absorber as claimed in claim 1 wherein the thickness of the absorber is less than $\lambda_{min}/100$.

16. An electromagnetic radiation absorber as claimed in claim 1 wherein the absorber is backed with an adhesive material.

17. An electromagnetic radiation absorber as claimed in claim 1 wherein the dielectric layer is sandwiched between the conductor layer and a second conductor layer.

18. An electromagnetic radiation absorber for absorbing radiation in the wavelength range $\lambda_{min}$ to $\lambda_{max}$ comprising a conductor layer in contact with a dielectric layer wherein the conductor layer includes a plurality of slits in a grating arrangement each slit having at least one dimension that is less than $\lambda_{min}$, wherein the thickness of the absorber is less than $\lambda_{min}/100$.

19. An electromagnetic radiation absorber according to claim 18, wherein the absorber is flexible.

20. An electromagnetic radiation absorber according to claim 18, wherein the plurality of slits are arranged in a bigrating.

21. An electromagnetic radiation absorber according to claim 18, wherein the dielectric comprises a material having an actively variable refractive index.

22. An electromagnetic radiation absorber according to claim 18, comprising a further conductor layer arranged such that the dielectric layer is sandwiched between the conductor layer and the further conductor layer.

* * * * *